(12) United States Patent
Zheng et al.

(10) Patent No.: US 10,883,966 B2
(45) Date of Patent: Jan. 5, 2021

(54) PIPE DEFECT ASSESSMENT SYSTEM AND METHOD

(71) Applicant: SCHLUMBERGER TECHNOLOGY CORPORATION, Sugar Land, TX (US)

(72) Inventors: Shunfeng Zheng, Katy, TX (US); Zhanke Liu, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 443 days.

(21) Appl. No.: 15/316,193

(22) PCT Filed: Jun. 4, 2015

(86) PCT No.: PCT/US2015/034152
§ 371 (c)(1),
(2) Date: Dec. 5, 2016

(87) PCT Pub. No.: WO2015/187923
PCT Pub. Date: Dec. 10, 2015

(65) Prior Publication Data
US 2017/0322182 A1 Nov. 9, 2017

Related U.S. Application Data

(60) Provisional application No. 62/007,484, filed on Jun. 4, 2014.

(51) Int. Cl.
*G06F 17/10* (2006.01)
*G06F 30/17* (2020.01)
(Continued)

(52) U.S. Cl.
CPC .......... *G01N 27/87* (2013.01); *E21B 47/092* (2020.05); *G01N 27/83* (2013.01); *G01R 33/09* (2013.01);
(Continued)

(58) Field of Classification Search
USPC .................................................. 703/2, 5, 6
See application file for complete search history.

(56) References Cited

U.S. PATENT DOCUMENTS 3,940,689 A  2/1976  Johnson, Jr.
4,636,727 A  1/1987  Kahil et al.
(Continued)

FOREIGN PATENT DOCUMENTS

EP  2725352 A1  4/2014
JP  H09-318586 A  12/1997
(Continued)

OTHER PUBLICATIONS

International Search Report issued in International Patent Application No. PCT/US2015/065202 dated Feb. 26, 2016; 14 pages.
(Continued)

*Primary Examiner* — Thai Q Phan
(74) *Attorney, Agent, or Firm* — Rodney Warfford

(57) ABSTRACT

A technique facilitates examination of a tubing string which may comprise coiled tubing or other types of pipe. A sensor is positioned to monitor a pipe for a magnetic flux leakage signal indicating a defect in the pipe. The sensor outputs data on the magnetic flux leakage signal to a data processing system. Correlations between magnetic flux leakage signals and fatigue life of the pipe may be accessed by the data processing system and these correlations may be used to automatically predict a fatigue life of the pipe. Based on the determined fatigue life, an operation with respect to the pipe is selected and such operation may comprise continued normal use, repair, or removal from service.

15 Claims, 4 Drawing Sheets

(51) Int. Cl.
| | |
|---|---|
| *G01N 27/87* | (2006.01) |
| *G06F 16/00* | (2019.01) |
| *G01N 27/83* | (2006.01) |
| *E21B 47/092* | (2012.01) |
| *G01R 33/09* | (2006.01) |

(52) U.S. Cl.
CPC .............. *G06F 16/00* (2019.01); *G06F 17/10* (2013.01); *G06F 30/17* (2020.01)

(56) References Cited

U.S. PATENT DOCUMENTS

| | | | |
|---|---|---|---|
| 4,675,604 A | 6/1987 | Moyer et al. | |
| 4,704,580 A * | 11/1987 | Moake | G01N 27/82 324/227 |
| 5,090,039 A | 2/1992 | Gard et al. | |
| 5,303,592 A | 4/1994 | Livingston | |
| 5,323,856 A | 6/1994 | Davis et al. | |
| 5,461,313 A * | 10/1995 | Bohon | G01N 27/902 324/240 |
| 5,581,037 A | 12/1996 | Kwun et al. | |
| 5,793,200 A | 8/1998 | Berrill | |
| 5,826,654 A | 10/1998 | Adnan et al. | |
| 5,914,596 A | 6/1999 | Weinbaum | |
| 6,023,986 A | 2/2000 | Smith et al. | |
| 6,205,869 B1 | 3/2001 | Schadt et al. | |
| 6,241,028 B1 | 6/2001 | Bijleveld et al. | |
| 6,316,937 B1 | 11/2001 | Edens | |
| 6,321,596 B1 | 11/2001 | Newman | |
| 6,404,189 B2 | 6/2002 | Kwun et al. | |
| 6,820,653 B1 | 11/2004 | Schempf et al. | |
| 6,967,478 B2 | 11/2005 | Wayman et al. | |
| 7,163,055 B2 | 1/2007 | Coon et al. | |
| 7,347,261 B2 | 3/2008 | Markel et al. | |
| 7,357,179 B2 | 4/2008 | Zheng et al. | |
| 7,414,395 B2 | 8/2008 | Gao et al. | |
| 7,571,054 B2 * | 8/2009 | Newman | E21B 17/00 702/6 |
| 7,783,432 B2 | 8/2010 | Orth et al. | |
| 8,049,494 B2 | 11/2011 | Lepage et al. | |
| 8,086,425 B2 | 12/2011 | Papadimitriou et al. | |
| 8,428,910 B2 * | 4/2013 | Papadimitriou | G01N 27/9046 702/183 |
| 8,542,127 B1 | 9/2013 | Goroshevskiy et al. | |
| 9,176,096 B2 | 11/2015 | Goroshevskiy et al. | |
| 9,322,805 B2 | 4/2016 | Koka et al. | |
| 9,581,567 B2 | 2/2017 | Goroshevskiy et al. | |
| 9,671,371 B2 | 6/2017 | Liu et al. | |
| 9,964,519 B2 | 5/2018 | Goroshevskiy et al. | |
| 10,247,657 B2 | 4/2019 | Allen et al. | |
| 10,288,583 B2 | 5/2019 | Chang et al. | |
| 10,317,331 B2 | 6/2019 | Guner et al. | |
| 10,330,641 B2 | 6/2019 | Goroshevskiy et al. | |
| 2001/0017541 A1 | 8/2001 | Kwun et al. | |
| 2001/0022514 A1 | 9/2001 | Light et al. | |
| 2001/0029989 A1 | 10/2001 | Paz | |
| 2003/0052670 A1 | 3/2003 | Miszewski | |
| 2003/0098697 A1 | 5/2003 | Tanaka | |
| 2003/0118230 A1 | 6/2003 | Song et al. | |
| 2003/0164053 A1 | 9/2003 | Ignagni | |
| 2003/0173072 A1 | 9/2003 | Vinegar et al. | |
| 2004/0095137 A1 | 5/2004 | Kwun et al. | |
| 2004/0103121 A1 | 5/2004 | Johnson et al. | |
| 2004/0205727 A1 | 10/2004 | Sit et al. | |
| 2004/0216512 A1 | 11/2004 | Kwun et al. | |
| 2005/0046591 A1 | 3/2005 | Pacault et al. | |
| 2005/0242169 A1 | 11/2005 | Michal | |
| 2006/0055584 A1 | 3/2006 | Waite et al. | |
| 2006/0096753 A1 | 5/2006 | Zheng et al. | |
| 2006/0184714 A1 | 8/2006 | Dang et al. | |
| 2006/0202685 A1 | 9/2006 | Barolak et al. | |
| 2006/0202686 A1 | 9/2006 | Barolak et al. | |
| 2006/0247868 A1 | 11/2006 | Brandstrom | |
| 2006/0254373 A1 | 11/2006 | Boudreaux | |
| 2007/0150084 A1 | 6/2007 | Grubb et al. | |
| 2007/0222436 A1 | 9/2007 | Gao et al. | |
| 2007/0222438 A1 | 9/2007 | Reeves | |
| 2008/0035334 A1 * | 2/2008 | Newman | E21B 17/00 166/250.01 |
| 2008/0106260 A1 | 5/2008 | Rogers | |
| 2008/0228412 A1 | 9/2008 | Orth et al. | |
| 2009/0243604 A1 | 10/2009 | Dutta et al. | |
| 2010/0131209 A1 * | 5/2010 | Pacelli | G01N 33/24 702/35 |
| 2010/0131450 A1 | 5/2010 | Nguyen et al. | |
| 2011/0191045 A1 | 8/2011 | Boenisch | |
| 2012/0130651 A1 * | 5/2012 | Papadimitriou | G01N 27/9046 702/35 |
| 2013/0057269 A1 | 3/2013 | Koka et al. | |
| 2013/0060487 A1 * | 3/2013 | Papadimitriou | G10L 15/22 702/34 |
| 2013/0124109 A1 | 5/2013 | Denenberg et al. | |
| 2014/0088889 A1 * | 3/2014 | Duckworth | G01N 27/82 702/35 |
| 2014/0107947 A1 * | 4/2014 | Papadimitriou | G01M 5/0033 702/34 |
| 2014/0200831 A1 | 7/2014 | Smith et al. | |
| 2014/0207390 A1 | 7/2014 | Zheng et al. | |
| 2014/0327443 A1 | 11/2014 | Liu et al. | |
| 2014/0368191 A1 | 12/2014 | Goroshevskiy et al. | |
| 2015/0061659 A1 | 3/2015 | Freear et al. | |
| 2015/0377012 A1 * | 12/2015 | Liu | E21B 19/22 702/6 |
| 2016/0231278 A1 | 8/2016 | Goroshevskiy et al. | |
| 2016/0231279 A1 * | 8/2016 | Hoyt | G01N 29/2412 |
| 2016/0231280 A1 * | 8/2016 | Zwanenburg | G01N 27/83 |
| 2016/0252422 A1 * | 9/2016 | Howitt | G01M 3/2807 73/40.5 A |
| 2016/0252481 A1 * | 9/2016 | Zheng | G01M 3/40 324/238 |
| 2017/0030850 A1 * | 2/2017 | Castaneda-Lopez | G01N 17/02 |
| 2017/0122309 A1 | 5/2017 | Kusumba et al. | |
| 2017/0122909 A1 | 5/2017 | Goroshevskiy et al. | |
| 2017/0241953 A1 | 8/2017 | Kagawa | |
| 2017/0261469 A1 | 9/2017 | Chang et al. | |
| 2017/0350864 A1 | 12/2017 | Goroshevskiy et al. | |
| 2017/0372704 A1 | 12/2017 | Papadimitriou et al. | |
| 2018/0106762 A1 | 4/2018 | Boenisch | |
| 2018/0149552 A1 | 5/2018 | Wayman et al. | |
| 2018/0188207 A1 | 7/2018 | Freear et al. | |
| 2018/0196005 A1 | 7/2018 | Fanini et al. | |
| 2018/0266992 A1 * | 9/2018 | Liu | G01R 33/10 |
| 2018/0321133 A1 | 11/2018 | Allen et al. | |
| 2018/0356365 A1 | 12/2018 | Liu et al. | |
| 2019/0056355 A1 | 2/2019 | Amineh et al. | |
| 2019/0072522 A1 | 3/2019 | Desjardins | |
| 2019/0145931 A1 | 5/2019 | Feng et al. | |
| 2019/0145932 A1 | 5/2019 | Feng et al. | |
| 2019/0145933 A1 | 5/2019 | Feng et al. | |
| 2020/0208769 A1 | 7/2020 | Du | |

FOREIGN PATENT DOCUMENTS

| | | |
|---|---|---|
| JP | H11-83842 A | 3/1999 |
| JP | 2744942 B2 | 5/2019 |
| RU | 2097649 C1 | 11/1997 |
| RU | 2102738 C1 | 1/1998 |
| RU | 2149254 C1 | 5/2000 |
| WO | 1998016842 A1 | 4/1998 |
| WO | 1999040724 A1 | 8/1999 |
| WO | 2003058545 A1 | 7/2003 |
| WO | 2012103541 A2 | 8/2012 |
| WO | 2012174057 A1 | 12/2012 |
| WO | 2014018844 A1 | 1/2014 |
| WO | 2015051225 A1 | 4/2015 |
| WO | 2015187923 A1 | 12/2015 |

(56) References Cited

FOREIGN PATENT DOCUMENTS

WO 2016094775 A1 6/2016
WO 2017100387 A1 6/2017

OTHER PUBLICATIONS

Christian et al., "Statistical Analysis of Coiled Tubing Fatigue Data", SPE 121457-MS, Presented at the SPE/ICoTA Coiled Tubing and Well Intervention Conference and Exhibition, The Woodlands, Texas, USA, Mar. 31-Apr. 1, 2009, 7 pages.
Newman, K. R., "Coiled Tubing Life Modeling," SPE 22820, SPE Annual Technical Conference and Exhibition, Dallas, Texas, Oct. 6-9, 1991, 7 pages.
Burgos, R., Mattos, R. F. and Bulloch, S., "Delivering Value for Tracking Coiled Tubing Failure Statistics," SPE 107098, SPE/ICoTA Coiled Tubing and Well Intervention Conference and Exhibition, Mar. 20-21, 2007, 8 pages.
Rosen, P. M. A., "Remote Coiled Tubing Operation Monitoring", SPE 46038, 1998 SPE/ICoTA Coiled Tubing Roundtable, Houston, Texas Apr. 15-16, 1998, 7 pages.
Stanley, R. K., "Results of a New Coiled Tubing Assessment Tool," SPE 141944, 2011 SPE/ICoTA Coiled Tubing and Well Intervention Conference and Exhibition, The Woodlands, Texas, Apr. 5-6, 2011, 8 pages.
Zheng, A., Liu, Z., Zwanenburg, M., Burgos, R., Scuadroni, N., Stayer, A., "State of the Art Portable Measurement and Defect Detection Technology for Coiled Tubing," SPE 163945, 2013 SPE/ICoTA Coiled Tubing and Well Intervention Conference & Exhibition, The Woodlands, Texas, Mar. 26-27, 2013, 8 pages.
Z. Liu, G. Minerbo, and A. Zheng, "Steel coiled tubing defect evaluation using magnetic flux leakage signals", SPE 168260, Coiled Tubing & Well Intervention Conference & Exhibition (ICoTA), The Woodlands, TX, Mar. 25-26, 2014, 16 pages.
University of Tulsa, CTMRC 2011-2012 Annual Project Review, Sep. 28, 2012, 49 pages.
Lynch, "Magnetic Flux Leakage Robotic Pipe Inspection: Internal and External Methods", Rice University, A Thesis Submitted in Partial Fulfillment of the Requirements for the Degree Master of Science, Houston, Texas, Dec. 2009, 57 pages.
Tipton, S. M., "Coiled Tubing Deformation Mechanics: Diametral Growth and Elongation", SPE 36336, ICoTA/SPE North American Coiled Tubing Roundtable, Feb. 26-28, 1996, 9 pages.
Tipton et al.., "Fatigue Integrity Analysis of Rotating Coiled Tubing", SPE 100068. 2006 SPE/ICoTA Coiled Tubing and Well Intervention Conference and Exhibition, the Woodlands, TX, USA, Apr. 4-5, 2006, 7 pages.
Stanley, R. K., "New Results from Electromagnetic and Ultrasound Inspection of Coiled Tubulars", SPE 121810, SPE/ICoTA Coiled Tubing and Well Intervention Conference and Exhibition, Mar. 31-Apr. 1, 2009, 8 pages.
International Search Report and Written Opinion issued in International Patent Appl. No. PCT/US2017/022620 dated Jun. 12, 2017; 12 pages.
International Search Report and Written Opinion issued in International Patent Appl. No. PCT/US2016/065495 dated Mar. 29, 2017; 16 pages.
International Search Report issued in International Patent Application No. PCT/US2015/034152 dated Sep. 10, 2015; 3 pages.
Written Opinion issued in International Patent Application No. PCT/US2015/034152 dated Sep. 10, 2015; 9 pages.
Tomas Padron, et al, "Fatigue Life of Coiled Tubing With External Mechanical Damage," SPE 107113, 2007 SPE/ICoTA Coiled Tubing and Well Intervention Conference and Exhibition, Mar. 20-21, 2007, 16 pages.
Jiang, Q., Experimental Study of Interference Factors and Simulation on Oil-Gas Pipeline Magnetic Flux Leakage Density Signal, Proceedings of the 2007 IEEE International Conference on Mechatronics and Automation, Harbin, China, 2007, pp. 3652-3656.

* cited by examiner

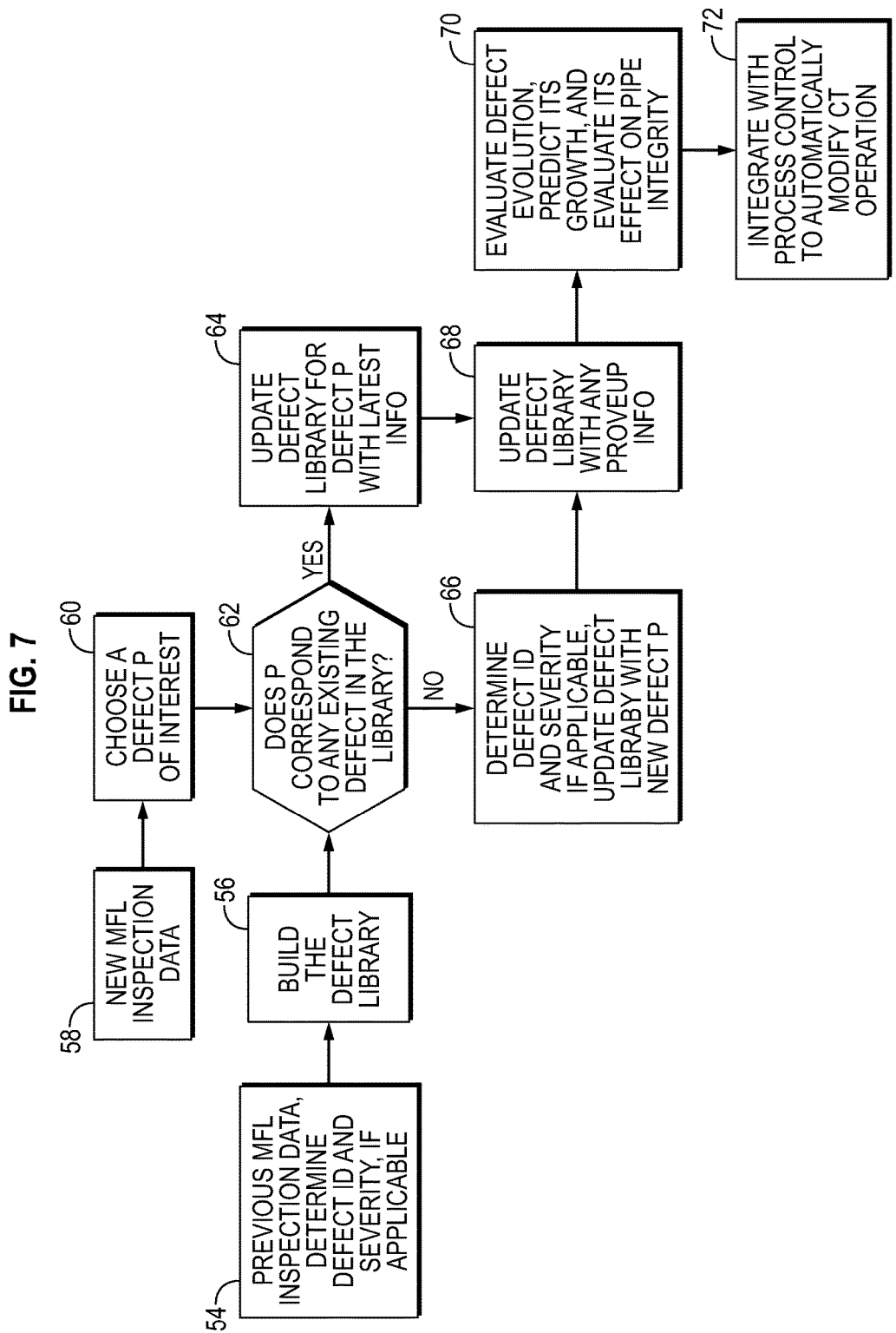

PIPE DEFECT ASSESSMENT SYSTEM AND METHOD

CROSS-REFERENCE TO RELATED APPLICATION

The present application is a 371 National Phase of International Patent Application No. PCT/US2015/034152 filed on Jun. 4, 2015, which is based on and claims priority to U.S. Provisional Application Ser. No.: 62/007,484 filed Jun. 4, 2014, both applications incorporated herein by reference.

BACKGROUND

During coiled tubing operations, manufacturing defects or defects due to operational damage can reduce coiled tubing fatigue resistance which may lead to premature failure of the coiled tubing. Failure of the coiled tubing can be catastrophic, resulting in substantial system and operational damage as well as great financial losses. Various methods have been employed to track coiled tubing defects and the effects of those defects with respect to coiled tubing fatigue. For example, the physical defects may be measured to determine a radial depth, transverse/circumferential width, length along an axis, defect shape, and/or other defect attributes. The type of defect is then used to determine an estimate of the severity of the defect and its impact on the fatigue life of the coiled tubing. However, the impact is difficult to predict due to the random nature of the defects and due to the difficulty in defining the shapes and dimensions of the defects. As a result, such analyses may be inconsistent and difficult to use in a reliable manner with respect to coiled tubing fatigue life predictions.

SUMMARY

In general, the present disclosure provides a methodology and system for examining a tubing string which may comprise coiled tubing or other types of pipe. A sensor is positioned to monitor a pipe for a magnetic flux leakage signal indicating a defect in the pipe. The sensor outputs data on the magnetic flux leakage signal to a data processing system. Correlations between magnetic flux leakage signals and fatigue life of the pipe may be accessed by the data processing system and these correlations may be used to automatically predict a fatigue life of the pipe. Based on the determined fatigue life, an operation with respect to the pipe is selected. By way of examples, such operation may comprise continued normal use, reducing operational loads such as pressure or the like, repair, or removal of the pipe from service.

BRIEF DESCRIPTION OF THE DRAWINGS

Certain embodiments will hereafter be described with reference to the accompanying drawings, wherein like reference numerals denote like elements. It should be understood, however, that the accompanying figures illustrate various implementations described herein and are not meant to limit the scope of various technologies described herein, and:

FIG. 7 is a flowchart illustrating an example of a procedure for defect tracking and evaluation with respect to pipe, according to an embodiment of the disclosure.

DETAILED DESCRIPTION

Figure 1:
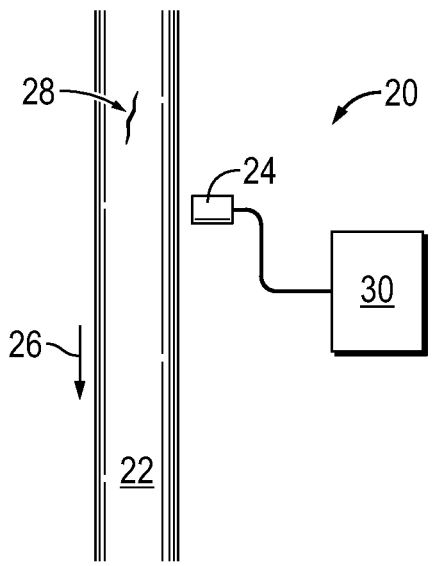
FIG. 1 is a schematic illustration of an example of a pipe defect assessment system for evaluating pipe, e.g. jointed pipe or coiled tubing, according to an embodiment of the disclosure.

In the following description, numerous details are set forth to provide an understanding of some illustrative embodiments of the present disclosure. However, it will be understood by those of ordinary skill in the art that the system and/or methodology may be practiced without these details and that numerous variations or modifications from the described embodiments may be possible. As utilized as part of the present disclosure, the terms "pipe", "joined pipe", "coiled tubing" may be used interchangeably to refer to a conveyance string used for downhole applications.

The disclosure herein generally relates to a methodology and system for evaluating pipe, e.g. coiled tubing, by employing a sensor system and a processing system. At least one sensor is positioned to monitor a pipe for a magnetic flux leakage signal indicating a defect in the pipe. In some examples, the at least one sensor is mounted to a fixture to monitor the magnetic flux leakage signal as coiled tubing or other pipe is moved past the sensor or sensors. The sensor outputs data regarding the magnetic flux leakage signal to a data processing system. Correlations between magnetic flux leakage signals and fatigue life of the pipe may be accessed by the data processing system and these correlations may be used to automatically predict a fatigue life of the actual pipe being evaluated. Based on the determined fatigue life, an operation with respect to the pipe is selected, e.g. continued normal use, repair, or removal of the pipe from service.

In some applications, the methodology is provided to evaluate the effect of defects, e.g. damage, regarding the fatigue life of coiled tubing. Effectively, the methodology provides a unique and efficient approach to assessing the effect of pipe defects on coiled tubing fatigue life through the use of a magnetic flux leakage tubing inspection system. In embodiments described herein, defects in coiled tubing or other pipe can be detected by monitoring a magnetic flux leakage signal. For example, elevated levels of the magnetic flux leakage signal correspond with specific defects which have been registered and stored on, for example, a memory associated with a data processing system. Once defects associated with a specific magnetic flux leakage signal are registered, the methodology is able to correlate the magnetic flux leakage signals associated with the actual defect to the fatigue life of the corresponding pipe, e.g. coiled tubing. In some applications, the correlation between magnetic flux leakage signal and fatigue life of the pipe may be determined without measuring the physical dimensions and/or shape of the defect.

According to embodiments of the methodology and system, a fatigue life analysis may be determined via various correlation techniques to correlate magnetic flux leakage signals of a defect with the fatigue life of the corresponding coiled tubing or other pipe. An example of such a correlation technique comprises establishing a correlation of a magnetic flux leakage signal of a defect on the pipe with a corresponding fatigue life of the pipe. The correlation is then used to predict the pipe fatigue life of a specific pipe being evaluated when a similar defect is determined via detection of a similar magnetic flux leakage signal on the actual pipe being evaluated. Many correlations between magnetic flux leakage signals associated with defects and fatigue life may be stored and then accessed by a data processing system for comparison with magnetic flux signals detected during pipe evaluation.

Another example of such a correlation technique comprises establishing correlations of magnetic flux leakage signals indicating defects on the pipe with a damage severity parameter and then establishing correlations between the damage severity parameter and the corresponding fatigue life of the pipe. These correlations are then used to predict the pipe fatigue life of a specific pipe when a similar defect is determined via detection of a similar magnetic flux leakage signal on the actual pipe being evaluated. In some applications, the correlation technique may comprise identifying the type of defect through defect matching. Specific types of defects and their corresponding impact on pipe fatigue life may be stored, and the detection of such a defect type may be used in combination with the correlation techniques to improve prediction of pipe fatigue life for an actual pipe being evaluated.

According to another example, the correlation technique may comprise integrating the fatigue life prediction and tracking of coiled tubing or other pipes with and without defects. The fatigue life of a pipe with a defect may be determined via correlations, such as the correlations described above, and the fatigue life of the pipe with defect is expressed as a function of the fatigue life of the same pipe, e.g. coiled tubing, without defect. The various examples of correlation techniques described above also may be used in a variety of combinations to further enhance the prediction of fatigue life or to provide redundancy of testing. In many applications, the correlation techniques may be performed on a data processing system, e.g. a computer-based system, to provide an automated and efficient fatigue assessment of coiled tubing or other pipe using the magnetic flux leakage-based tubing inspection system described herein. Then, based on the determined fatigue life, an operation with respect to the pipe is selected and performed. Examples of such operations include continued normal use of the pipe, reducing operational loads, repair of the pipe, or removal of the pipe from service.

Referring generally to FIG. 1, an example of a pipe damage assessment system 20 for evaluating pipe 22, e.g. jointed pipe or coiled tubing, is illustrated. It should be noted that the embodiments described herein may be employed in well or non-well related applications. Additionally, the pipe damage assessment system 20 may comprise a variety of pipe support systems, pipe delivery systems, sensor arrangements, local and/or remote processing systems, data evaluation algorithms, models, and/or other software programs, as well as other components arranged in various configurations depending on the parameters of a pipe damage assessment application.

In FIG. 1, an embodiment of the pipe evaluation system 20 is illustrated as moving pipe 22 past an appropriate sensor or sensors 24. In embodiments described herein, the sensor or sensors 24 may comprise magnetic flux leakage (MFL) sensors which detect magnetic flux leakage. The relative movement of pipe 22 is indicated by arrow 26, however some embodiments may be constructed to move the sensor or sensors 24 along a stationary pipe 22. Additionally, both the pipe 22 and the sensor(s) 24 may be moved relative to each other.

Each sensor 24 is positioned to monitor for the presence of a magnetic flux leakage signal associated with a defect 28 and to output sensor data to a data processing system 30. The signals provided by sensor 24 change upon detection of the differing magnetic flux leakage signal associated with the defect or defects 28. The changes in that sensor data can be processed via data processing system 30 to determine, for example, whether the detected magnetic flux leakage signal associated with the defect 28 is the same or similar to stored magnetic flux leakage signal data correlated with a particular defect type. The MFL sensor or sensors 24, for example, monitor the magnetic flux leakage changes to determine whether the magnetic flux leakage signal has characteristics associated with the defect. The magnetic flux leakage signal data is relayed from the sensor 24 to the data processing system 30 for evaluation, as described in greater detail below.

In the example illustrated, sensor or sensors 24 detect magnetic flux leakage but the sensors 24 may be combined with other types of sensors positioned to help detect and analyze a desired defect or defects along pipe 22. In some embodiments sensor 24 may comprise a single sensor but sensor 24 also may comprise a plurality of sensors or sensor elements arranged longitudinally and/or circumferentially. In a specific embodiment, sensor 24 comprises a plurality of magnetic flux leakage sensing elements positioned along the circumference of pipe 22 as pipe 22 and sensor(s) 24 moved relative to each other. By way of example, pipe 22 may be in the form of coiled tubing which moves relative to the sensor; or pipe 22 may comprise individual pipe joints which are moved relative to the sensor.

Data obtained by the sensor or sensors 24 is transmitted to processing system 30. The processing system 30 may be located in whole or in part at a well site, at a well testing facility, and/or at a remote location. After processing data from each sensor 24, the processing system 30 may be used to display or otherwise output results of the processing related to the detection and evaluation of magnetic flux leakage signal data corresponding with defect 28. The raw and/or processed data may be sent to other systems and other locations for further processing, analysis, and/or control operations.

Figure 2:
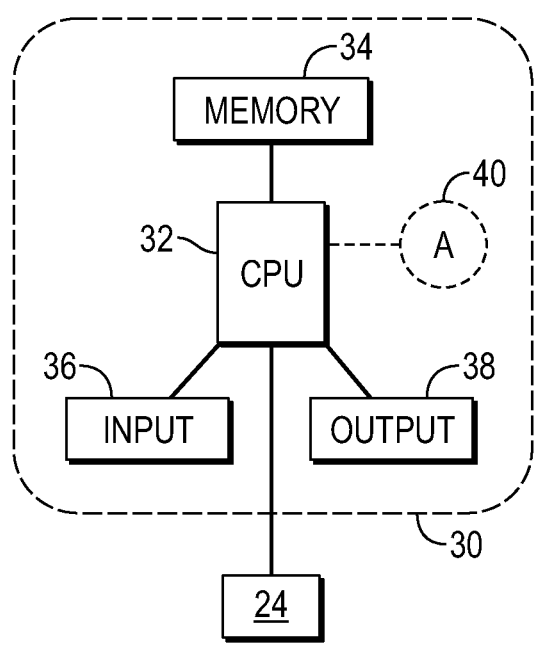
FIG. 2 is a schematic illustration of a processor-based system for evaluating sensor data obtained while evaluating pipe, according to an embodiment of the disclosure.

Referring generally to FIG. 2, an example of processing system 30 is illustrated. In this example, processing system 30 is in the form of a computer-based system having a processor 32, such as a central processing unit (CPU). The processor 32 is coupled with sensor or sensors 24 and is operatively employed to intake magnetic flux leakage signal data related to defects 28 and then to process the data, e.g. run appropriate models and/or algorithms. For example, the data may be processed to find similar stored signal data of the defect(s) 28 correlated with fatigue life for that specific type of pipe 22. The processor 32 also may be operatively coupled with a memory 34, an input device 36, and an output device 38.

In some applications, processor 32 is used to run selected algorithms/models, e.g. comparisons with stored correlations, via a software module 40. For example, the software module 40 may comprise pattern matching software which compares magnetic flux leakage data and/or other data obtained from each sensor 24 to a predetermined database containing known defects and/or correlations between magnetic flux leakage signal data and pipe fatigue life. In some applications, the pattern matching software also may be used to compare image data or other types of data to stored data on predetermined types of defects. By way of example, a correlation database may be stored in memory 34 and/or in another storage area accessible by CPU 32. Software module 40 may comprise many types of models, algorithms, and programs selected according to the types of sensors 24, environmental considerations, types of defects anticipated, and/or other parameters.

By way of example, input device 36 may comprise a variety of devices, such as a keyboard, mouse, voice recognition unit, touchscreen, other input devices, or combinations of such devices. Output device 38 may comprise a visual and/or audio output device, such as a computer display, monitor, or other display medium having a graphical user interface. The processing may be done on a single device or multiple devices on location, away from the pipe testing location, or with some devices located on location and other devices located remotely. Once the desired algorithm, modeling, software, and/or other programming of software module 40 is stored in, for example, memory 34, processing system 30 may be operated to detect and evaluate magnetic flux leakage signals associated with defects 28. The data processing system 30 and software module 40 work in cooperation to perform, for example, the magnetic flux leakage signal identification and matching of that magnetic flux leakage signal data with stored correlations of various types which may ultimately correlate magnetic flux leakage signal data with fatigue life of the pipe, e.g. coiled tubing. In some applications, the detection and evaluation of magnetic flux leakage signals associated with specific defects may be performed in real time.

Figure 3:
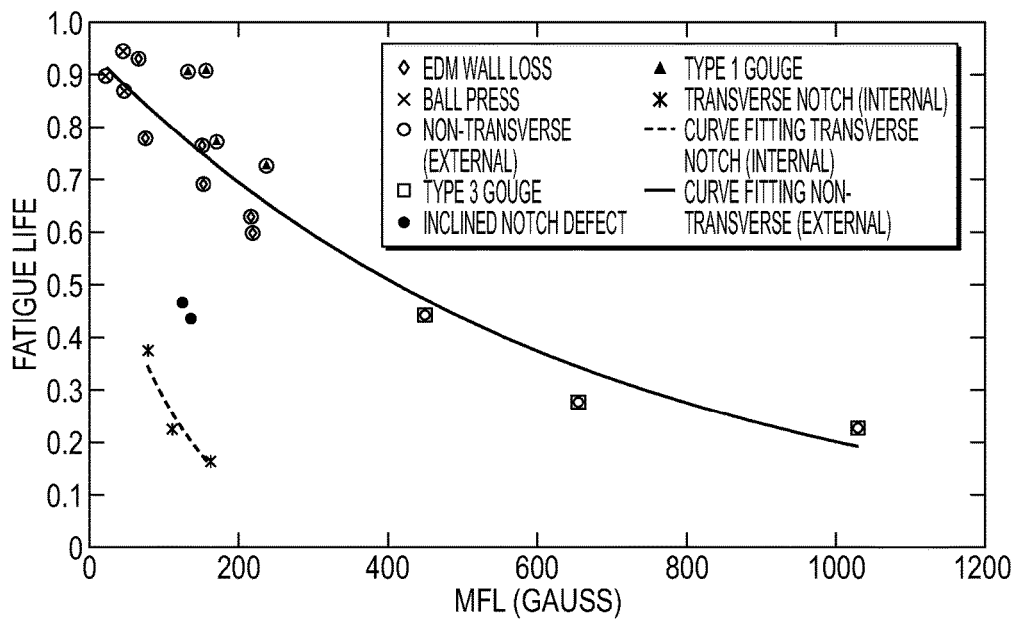
FIG. 3 is a diagrammatic representation of correlations between magnetic flux leakage signals indicating defects and the fatigue life of a pipe, e.g. coiled tubing, according to an embodiment of the disclosure.

Once the correlations have been established, pipe damage fatigue assessment and pipe fatigue tracking may be automatically processed without user intervention via data processing system 30. As discussed above, one correlation technique utilizes direct correlations between magnetic flux leakage signals and fatigue life of the pipe, e.g. coiled tubing, being evaluated. Referring generally to FIG. 3, direct correlations between the magnetic flux leakage signals and coiled tubing fatigue is illustrated graphically.

FIG. 3 illustrates in graphical form test data for coiled tubing with various defects. The vertical axis represents the fatigue life ratio of the coiled tubing samples, and the horizontal axis represents the magnetic flux leakage signals resulting from specific defects as recorded by magnetic flux leakage pipe evaluation system 20 and/or otherwise previously recorded. An example of a suitable pipe evaluation system 20 with an appropriate magnetic flux leakage sensor 24 is the CoilScan™ system available from Schlumberger Corporation. The correlations between magnetic flux leakage signals representing defects and coiled tubing fatigue may be accessed by data processing system 30 for comparison to the magnetic flux leakage signal during evaluation of similar coiled tubing (or other pipe). By way of example, the correlations may be stored in memory 34 of data processing system 30.

As illustrated in FIG. 3, a strong correlation exists between the magnetic flux leakage and the fatigue life of the pipe. Furthermore, the correlations between magnetic flux leakage and fatigue life depends on the type of defects. According to an embodiment of the present methodology, correlations between the magnetic flux leakage signal and fatigue life are first established via, for example, test data such as the test data accumulated in FIG. 3. These correlations are then stored and used in conjunction with a magnetic flux leakage-based pipe inspection system 20 to predict the fatigue life of coiled tubing or other pipe 22 with defects 28, e.g. damage. The correlations may depend on a variety of factors, such as the material grade of the pipe, e.g. coiled tubing, the operating conditions (pressure level, H2S concentration, etc), and the types of defects 28.

According to another embodiment of the methodology, correlations between the magnetic flux leakage signal and a damage severity parameter are established. Through years of research, the pipe/coiled tubing industry has established a damage severity parameter as a function of defect and tubing dimensions. Examples of defect dimensions include radial depth, transverse/circumferential width, axial length, projection areas, and shape; examples of tubing dimensions include tubing diameter and tubing wall thickness. The damage severity parameter has been determined to correlate with fatigue life of the coiled tubing or other pipe, and many correlations between the damage severity parameter and fatigue life ratio have been established, as represented graphically in FIG. 4. It is understood that different levels of statistical confidences may be introduced into the quantitative correlations to accommodate the nature of testing data and deviation of real world conditions from the control parameters used for testing, and different levels of operation criticality.

Figure 4:
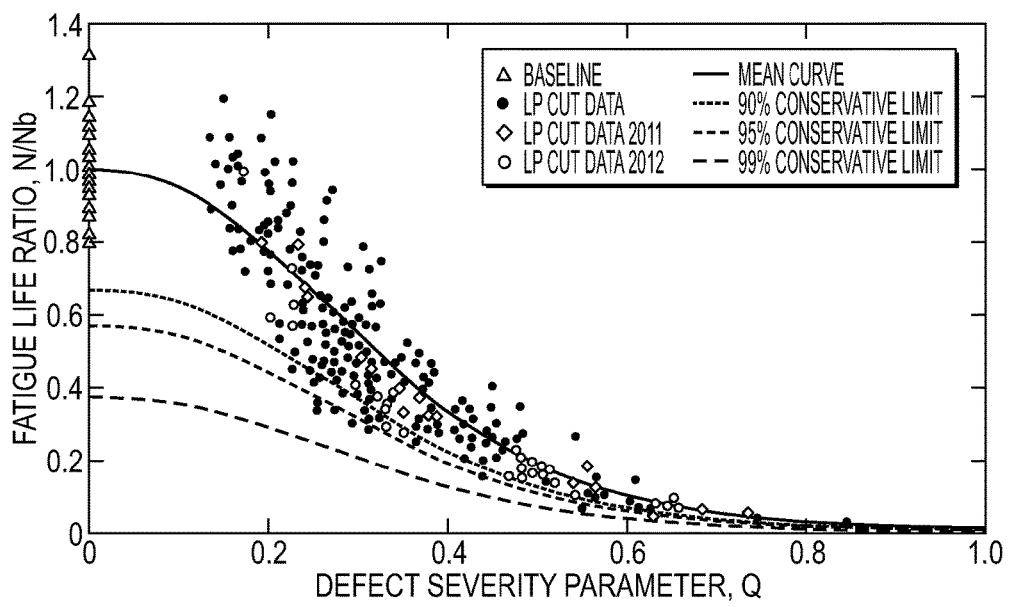
FIG. 4 is a diagrammatic representation of correlations between a defect related damage severity parameter and the fatigue life of a pipe, e.g. coiled tubing, according to an embodiment of the disclosure.
Figure 5:
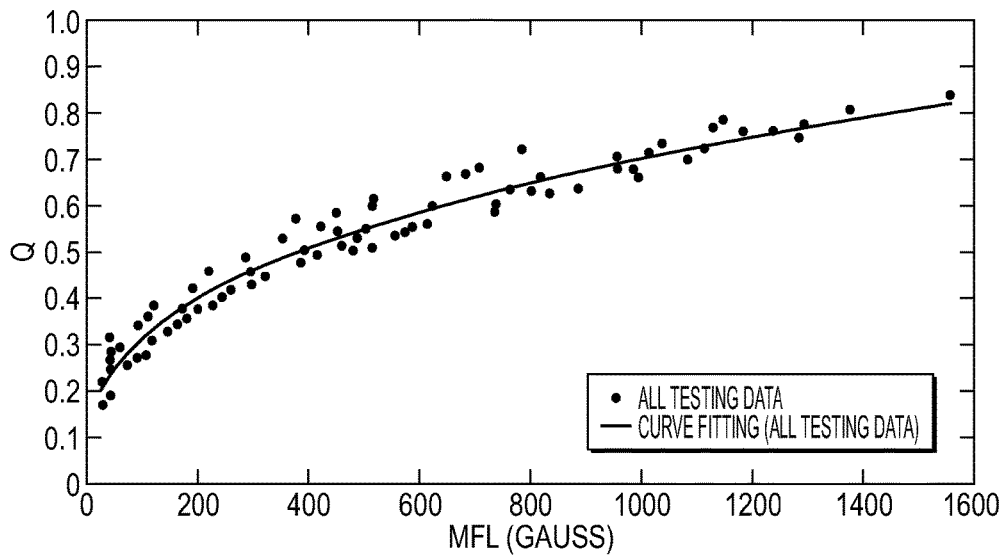
FIG. 5 is a diagrammatic representation of correlations between magnetic flux leakage signals indicating defects and a defect related damage severity parameter, according to an embodiment of the disclosure.

FIG. 4 illustrates a large number of data points showing coiled tubing fatigue life as a function of the damage severity parameter Q. The vertical axis represents the fatigue life ratio of coiled tubing 22 and the horizontal axis represents the defect severity parameter. The correlations between the defect severity parameter and fatigue life ratio may depend on a variety of factors, such as the material grade of the pipe, e.g. coiled tubing, the operating conditions (pressure level, H2S concentration, etc), and the types of defects. According to an embodiment, correlations are established between magnetic flux leakage signals representing defects and the damage severity parameter (as shown in FIG. 5) and further correlations are established between the damage severity parameter and fatigue life (as shown in FIG. 4) of the pipe 22. Each correlation technique described herein enables automatic prediction of pipe fatigue life via data processing system 30. Then, based on the determined fatigue life, an operation with respect to the pipe 22 is selected and performed. Examples of such operations include continued normal use of the pipe, reduction in operating pressure, repair of the pipe, or removal of the pipe from service.

Referring generally to FIG. 5, the correlations between the damage severity parameter and the magnetic flux leakage signal representing defects is illustrated. In this example, the vertical axis represents the damage severity parameter and the horizontal axis represents the magnetic flux leakage signal associated with specific defects. In this methodology, a full set of correlations is established between the magnetic flux leakage signals and the damage severity parameter as well as between the damage severity parameter and the fatigue life of the coiled tubing or other pipe 22. Consequently, data processing system 30 may be used to compare data collected via magnetic flux leakage sensor 24 during testing of a given pipe. The magnetic flux leakage data may then be compared to the stored correlations between magnetic flux leakage signals, damage severity parameters, and pipe fatigue life to automatically evaluate and predict fatigue life of a given pipe 22, e.g. coiled tubing, based on the defects 28 detected in the pipe 22 via sensor 24.

In some applications, an enhanced fatigue assessment of coiled tubing 22 (or other pipe) with possible defects 28 may be performed. For a given magnetic flux leakage signal indicating a defect, the type of defect (e.g. longitudinal or transverse orientation, internal or external type, cut, press, or other defect characteristics) can affect the fatigue life of the pipe. In some applications, the accuracy of the fatigue assessment and prediction can be increased by incorporating the type of defect into the recorded correlations described above.

According to a coiled tubing example, the direct correlations between magnetic flux leakage signal and coiled tubing fatigue life or the correlations between magnetic flux leakage signal, damage severity parameter, and coiled tubing fatigue life may initially be established. The magnetic flux leakage assessment system 20 is then used to evaluate a given coiled tubing to detect defects 28. An appropriate defect identification methodology is then used to identify the type of defect under consideration. Once the type of defect is identified, the appropriate correlations may be selected for that type of defect to determine the corresponding fatigue life based on the recorded correlations.

Figure 6:
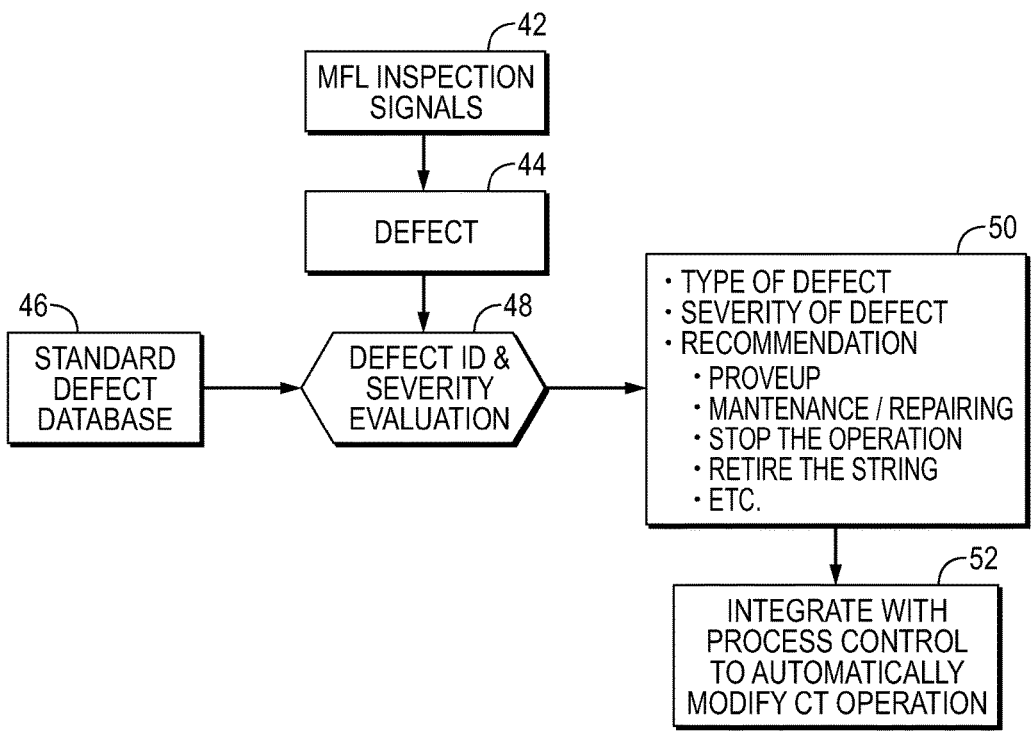
FIG. 6 is a flowchart illustrating an example of a procedure for defect identification and severity evaluation with respect to pipe, according to an embodiment of the disclosure.

Referring generally to FIG. 6, an example of a defect identification methodology is illustrated. In this example, the magnetic flux leakage sensor or sensors 24 output inspection signals for evaluation by data processing system 30, as represented by block 42 of the flowchart illustrated in FIG. 6. The defect identification and severity evaluation process may comprise a software method and/or process embodied in, for example, software module 40 which detects the existence of a defect 28, as represented by block 44. Existence of the defect 28 may be based on a factor or a plurality of factors, including tubing geometry measurements, magnetic flux leakage, signal thresholds, and/or other factors.

The defect identification and evaluation methodology also may utilize a standard defect database, as represented by block 46. The standard defect database may be stored in memory 34 or in another suitable storage location accessible by CPU 32 of data processing system 30. The standard defect database may be used to store data representative of defects that occur during actual operations employing pipe 22 or other pipes of similar property. Examples of the stored defects include mechanical dents, gouges, corrosion pits, and/or other types of defects. The stored defect data may be used in combination with the stored correlations data described above to improve predictions of pipe fatigue life. For example, the stored defect data may be used in a redundant process or in a supplemental process with respect to the use of correlations between magnetic flux signal data and pipe fatigue life.

Such defects may be either internal or external defects. Within the standard defect database, each type of defect may have a data entry or entries for the defect according to its position with respect to different orientations, such as axial (longitudinal) orientations, transverse (circumferential) orientations, inclined (between axial and transverse) orientations, and/or other orientations. Each type of defect also may contain the type of mechanism that causes the defect to occur, such as dent, gouge, abrasion, corrosion, manufacturing process mechanism, or other mechanisms. Additionally, each type of defect may have a data entry or entries for various defect dimensions, such as depth, width, length, and/or other dimensions. Each type of defect may further contain a defect severity threshold or thresholds that conform to a service quality policy. In many applications, the defect database is not static but can be enriched and enhanced on a dynamic basis as new data becomes available regarding defects. Low-quality data, outdated defect entries, and/or other undesirable data may sometimes be removed from the standard defect database based on, for example, new data obtained from testing and/or field use of the pipe 22 or other similar pipes.

Each entry in the standard defect database may contain a number of materials and defect attributes. Examples of data representing such attributes include a digital description of the defect, such as a picture and/or image of the defect. The picture/image may comprise a camera picture, a laser scan picture, an x-ray picture, a dye penetration picture, a magnetic particle imaging picture, a metallurgy analysis picture, and/or other suitable pictures/images. Additional examples of data representing such attributes comprise data on the common dimensions of the defect, the MFL signals for the corresponding physical defect (which may include signals for the same defect at its different stages), an inspection threshold of the corresponding defect type, and/or other operational safety attributes.

In the embodiment illustrated, the defect identification and severity evaluation process further utilizes a defect identification and severity evaluation algorithm, as represented by block 48. The defect identification algorithm may be embodied in software module 40 and is employed via processor/CPU 32 to compare the defect signal based on data from the magnetic flux leakage sensor(s) 24 against the standard defect database 46. By calculating the correlation of this defect signal with the entries in the standard defect database 46, the algorithm determines the closest match between a corresponding defect in the database 46 and the potential defect 28 detected via sensor 24, as represented by block 50.

The software module 40, e.g. algorithm, also is used to perform a defect severity evaluation on the defect signal by making use of, for example, the results of a signature match with the standard corresponding defect selected from the standard defect database (see block 50). Once the algorithm identifies that defect 28 is of the same type as a stored defect in the standard defect database 46, the algorithm evaluates the severity of the defect 28 by comparing the level of magnetic flux leakage signal associated with the defect 28 against the severity threshold in the stored defect. The severity threshold may be used to determine fit-for-service with respect to the corresponding pipe 22 and its intended operation envelope, service guidelines, or other suitable criteria. This evaluation of defect type may be used in combination with the magnetic flux signal and fatigue life correlations described above.

In some applications, the software module/algorithm 40 may be selected or programmed to perform a more elaborate numerical analysis. The more elaborate numerical analysis may take into account the magnetic flux leakage signal related to the defect 28 and the geometrical information from a standard defect stored in the standard defect database 46 to determine the actual dimensions for the defect 28. This knowledge facilitates evaluation of the effect of the defect 28 on the mechanical integrity of the pipe 22. In some applications, the nature of an u/unknown defect 28 may be determined by finding a benchmark defect in the standard defect database.

Results of the severity evaluation may comprise information on defect size (e.g. length, width, depth), defect topology (e.g. a single defect or an array of defects), detrimental effects on remaining life of the pipe (e.g. remaining coiled tubing fatigue life), detrimental effects on the safe operation envelope of the pipe (e.g. safe operation envelope of coiled tubing), and/or other results. In some applications, the evaluation of defect severity may be performed in conjunction with other types of software, such as existing coiled tubing operation and job design software.

In various applications, the defect severity evaluation also may be used as a quality control tool. For example, the defect database 46 may comprise manufacturing features such as bias weld, seam weld, grind repair, and/or other manufacturing features. For quality control purposes, the database 46 may comprise both normal and abnormal manufacturing features. Using the defect identification algorithm/software module 40, an operator may distinguish the abnormal features from the normal features. This enables further actions to be taken to overcome the abnormal features or to reject the pipe 22 under a quality control regimen.

Additionally, the defect identification algorithm/software module 40 may be utilized in real time during an operation utilizing the pipe 22, e.g. during a coiled tubing operation in a wellbore. In some applications, the software module 40 may be integrated into additional real time data acquisition and analysis software and/or into post-operation analysis software. The real time and/or post-operation modes may be executed on-site and/or at a remotely connected location via satellite or the Internet. As discussed above, the data processing system 30 may be located on-site, remotely, or with part of the system located on-site and part of the system located remotely.

As further illustrated in block 50 of FIG. 6, the defect identification and severity evaluation process also may comprise outputting defect identification and severity evaluation results via, for example, output device 38. The results may be presented to an operator and/or other user and may provide an indication of the type of defect and/or the severity of the defect. The results also may provide recommendations with respect to actions that may be taken in light of the type and severity of the defect. By way of example, the recommendations may comprise performing further prove-up (employing visual or manual inspection of the identified defect 28), performing maintenance, e.g. grinding out the defect, stopping the operation, retiring the string or joint of pipe 22, and/or other actions (see block 50). The results also may give an indication as to the in-situ integrity of the pipe 22, whether the pipe 22 is fit for a given service, and/or whether the pipe 22 meets other predetermined criteria.

The results and the recommendations based on those results may be integrated with process control to automatically modify an operation related to pipe 22, as represented by block 52. In a coiled tubing operation related to a well, for example, the recommendations may be used by the coiled tubing process control system to automatically modify the coiled tubing operation, such as to reduce the operating pressure. The coiled tubing process control system or other process control system may be part of or may work in cooperation with data processing system 30. In various applications, the modification of the coiled tubing operation or other pipe related operation may be made in real time during the operation.

Referring generally to FIG. 7, an example of a process for defect tracking and severity evaluation is illustrated. This process may be employed to track the defect and to help predict defect growth. The process may comprise at least one of a plurality of components including: using the first available magnetic flux leakage inspection data for a pipe 22, e.g. tubing string; locating each defect 28 in the pipe 22; and, if applicable, identifying the corresponding signature of each defect 28 from the defect entries stored in the standard defect database, as discussed above, and as represented by block 54.

Additionally, the process for defect tracking and severity evaluation may comprise building a defect library for the pipe 22, e.g. tubing string, as represented by block 56. Each of the defects stored in the defect library may comprise an individual attribute or a plurality of attributes including, for example, magnetic flux leakage signal, location of defect 28 on the pipe 22, corresponding tubing/pipe wall thickness, corresponding standard signature, pipe dimensions, whether the defect has been proved up by visual inspection, inspector validation, and/or other suitable attributes.

In this example, the process may further comprise taking and/or choosing a given subsequent inspection data, as represented by block 58. The process also may comprise choosing a defect 28 of interest from the subsequent inspection data, as represented by block 60, while noting/storing the corresponding location of the defect 28 in the pipe 22. The process may further comprise determining whether the same defect exists in previous inspection data by finding whether there is a match between the defect 28 and a stored defect in the defect library, as represented by block 62. Determining whether a match exists may involve considering various similarities, such as sensor signal similarity, depth similarity, wall thickness similarity, and/or other similarities.

If a match exists (see block 62), the library may be updated automatically or by operator choice with the latest data for the defect 28, as represented by block 64. This type of historical data regarding defects 28 may be kept and stored in the defect library for future use by data processing system 30. If there is no match (see block 62), the defect tracking and severity evaluation process may comprise identifying a corresponding signature of the defect 28 from the standard defect database, if applicable, and updating the defect library with the addition of the new defect data on defect 28, as represented by block 66. In some applications, the library may be updated by capturing a list of defects from a new pipe inspection job or other relevant pipe inspection jobs.

If prove-up is performed on the defect 28, the defect tracking and severity evaluation process may include updating the data and/or information in the defect library as well as updating the inspector's validation attributes, if applicable, as represented by block 68. Additionally, if repair activities are performed, e.g. grinding out the defect, the quality of such repair activities may be evaluated using the standard defect database. The quality of the repair can be checked by matching the magnetic flux leakage signature of the repaired defect with, for example, a bad repair signature in the standard defect database. If a match occurs with respect to the bad repair signature, further repair work should be performed and the defect should be reworked until suitable quality criteria are met.

The process may further comprise conducting data analysis on the history of the defect 28, predicting the future evolution of the defect 28, and/or predicting the effect of the defect 28 on pipe integrity, as represented by block 70. It should be noted that a useful part of the process may be determining the first occurrence of a given defect 28. If the pipe inspection operations are missing magnetic flux leakage inspections, it may be feasible to provide statistical estimations of the first appearance of certain defects based on job history and defect tracking results. In an embodiment, the number of bending cycles and the pumping pressures during defect evolution occurring since the first appearance of the defect 28 may be tracked in combination with tracking defects detected by the system 20. The data may be used to help predict defect growth.

The defect tracking and severity evaluation process also may comprise providing feedback information to a process control to enable automatic modification of operational parameters, as indicated by block 72. For example, the process may provide feedback information to a coiled tubing process control so as to automatically modify operational parameters of the coiled tubing operation. Such feedback may help mitigate/reduce the impact on the remaining coiled tubing fatigue life and/or coiled tubing strength due to the defects. It should be noted that the methodology described above with reference to FIGS. 6 and 7 is one example of a defect identification methodology which may be used to identify the type of defect under consideration for combination with the correlation techniques described above with reference to FIGS. 3-5.

According to another methodology, the pipe fatigue life prediction is integrated with the tracking and evaluation of the pipe both with and without defect. For example, the fatigue life of coiled tubing with a defect used in the stored correlations described above can be expressed as a function of fatigue life of the same coiled tubing without the defect. This allows conventional methods of fatigue life prediction for coiled tubing without defects to be incorporated into the assessment of fatigue life for coiled tubing with defects. As illustrated in FIG. 4, for example, the correlation of fatigue life for coiled tubing with a defect may be expressed as a ratio of fatigue (N/Nb) versus the damage severity parameter, where N represents the fatigue cycle with defect and Nb represents a baseline fatigue cycle without defect. Conventional methods may be used to determine Nb. Then, by using the correlation N/Nb versus the damage severity parameter a determination of the fatigue life of the coiled tubing 22 (or other pipe) with defect (N) may be automatically determined via data processing system 30. This methodology provides a unified approach to assess the coiled tubing fatigue with or without defects.

The system and methodologies described herein may be employed in non-well related applications which utilize evaluation of coiled tubing, jointed pipe, and/or other tubing strings. Additionally, processes may employ a variety of sensors, data processing systems, and/or software modules for evaluating sensor data and/or making recommendations. The system may be automated to implement automatic changes to a tubing string operation based on defect data detected and evaluated. In some applications, the operational changes can be made in real time. Additionally, various types of storage databases/libraries may be constructed to accumulate many types of correlations and defect data. Also, elements of the overall processes described herein may be performed at a variety of times and in various orders during implementation of the processes.

Although a few embodiments of the system and methodology have been described in detail above, those of ordinary skill in the art will readily appreciate that many modifications are possible without materially departing from the teachings of this disclosure. Accordingly, such modifications are intended to be included within the scope of this disclosure as defined in the claims.

What is claimed is:

1. A method for examining a tubing string, comprising:
providing a sensor to monitor a pipe for a magnetic flux leakage signal indicating a defect in the pipe;
outputting data on the magnetic flux leakage signal detected by the sensor to a data processing system;
using correlations between magnetic flux leakage signals and recorded data on fatigue life with respect to the type of pipe being monitored to automatically predict a fatigue life of the pipe via the data processing system based on the data detected by the sensor, wherein using comprises using correlations between the magnetic flux leakage signal associated with the defect and a damage severity parameter and then further using correlations between the damage severity parameter and the fatigue life, and wherein using further comprises identifying the type of defect through defect matching with a defect library stored in a memory associated with the data processing system; and
selecting an operation with respect to the pipe which is appropriate given the determined fatigue life.

2. The method as recited in claim 1, wherein using comprises using direct correlations between the magnetic flux leakage signal and the fatigue life of the pipe.

3. The method as recited in claim 1, wherein using comprises evaluating the fatigue life of the pipe as a function of the fatigue life of a similar pipe without the defect.

4. The method as recited in claim 1, wherein providing comprises providing the sensor to monitor coiled tubing.

5. The method as recited in claim 1, further comprising using the data processing system to automatically recommend a future action with respect to the pipe.

6. The method as recited in claim 1, further comprising capturing a list of defects from a pipe inspection job in a defect library.

7. The method as recited in claim 6, further comprising storing data of the magnetic flux leakage signal and the corresponding type of defect in the defect library.

8. A method, comprising:
using a sensor to monitor coiled tubing for the presence of a magnetic flux leakage signal indicative of a defect in the coiled tubing;
outputting data from the sensor to a data processing system having a processor;
providing the data processing system with correlations between the magnetic flux leakage signals associated with defects and fatigue life of a similar coiled tubing, wherein providing comprises providing correlations between magnetic flux leakage signals associated with defects and a damage severity parameter and then further providing correlations between the damage severity parameter and the fatigue life, and wherein providing further comprises identifying the type of defect through defect matching with a defect library stored in a memory associated with the data processing system;
processing the data from the sensor regarding the magnetic flux leakage signal via the data processing system to predict a fatigue life of the coiled tubing based on the correlations, wherein processing comprises utilizing the type of defect detected by the sensor to improve the accuracy of predicting the fatigue life, the processing further comprising comparing the magnetic flux leakage signal of the defect with stored data regarding standard defects to determine geometrical information of the defect affecting the mechanical integrity of the pipe; and taking an action with respect to future use of the coiled tubing based on the fatigue life.

9. The method as recited in claim 8, wherein taking the action comprises automatically changing a coiled tubing operation.

10. The method as recited in claim 8, wherein taking the action comprises rejecting use of the coiled tubing for a given coiled tubing operation.

11. The method as recited in claim 8, wherein providing comprises providing direct correlations between magnetic flux leakage signals and the fatigue life of the similar coiled tubing.

12. The method as recited in claim 8, wherein providing comprises evaluating the fatigue life of a coiled tubing with a defect as a function of the fatigue life of the coiled tubing without the defect.

13. The method as recited in claim 8, wherein providing comprises evaluating the fatigue life with different levels of statistical confidence.

14. A system for defect evaluation, comprising:
a sensor positioned along a pipe to monitor for a magnetic flux leakage signal associated with a defect in the pipe; and
a data processing system coupled to the sensor, the data processing system comprising a memory in which correlation data between magnetic flux leakage signals associated with defects and a damage severity parameter are stored, and in which a defect library is stored, the data processing system further comprising a processor which processes data received from the sensor regarding the magnetic flux leakage signal and then, based on the type of pipe being monitored and on evaluation of correlations between the magnetic flux leakage signal associated with the defect and the damage severity parameter, and based on correlations between the damage severity parameter and fatigue life, identifies the type of defect through defect matching with the defect library and outputs a prediction of the fatigue life with respect to the pipe.

15. The system as recited in claim 14, wherein the data processing system processor is configured to automatically change the operating conditions of the pipe based on the prediction of the fatigue life.

* * * * *